United States Patent
Song

(10) Patent No.: US 7,489,171 B2
(45) Date of Patent: Feb. 10, 2009

(54) ADAPTIVE DELAY-LOCKED LOOPS AND METHODS OF GENERATING CLOCK SIGNALS USING THE SAME

(75) Inventor: In-Dal Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 168 days.

(21) Appl. No.: 11/708,432

(22) Filed: Feb. 21, 2007

(65) Prior Publication Data

US 2007/0194825 A1 Aug. 23, 2007

(30) Foreign Application Priority Data

Feb. 21, 2006 (KR) ................ 10-2006-0016499

(51) Int. Cl.
*H03L 7/06* (2006.01)
(52) U.S. Cl. .................................. 327/158
(58) Field of Classification Search ............. 327/156, 327/158, 159
See application file for complete search history.

(56) References Cited

U.S. PATENT DOCUMENTS 7,365,583 B2 * 4/2008 Shin ........................ 327/158
7,388,805 B2 * 6/2008 Lee et al. ................. 365/233.1

FOREIGN PATENT DOCUMENTS

| JP | 2001-237680 | 8/2001 |
|---|---|---|
| JP | 2005-020083 | 1/2005 |
| KR | 1020040046323 A | 6/2004 |
| KR | 1020040056909 A | 7/2004 |
| KR | 1020040021479 A | 10/2004 |

OTHER PUBLICATIONS

Korean Office Action (dated Mar. 28, 2007) for counterpart Korean Patent Application 2006-16499.

* cited by examiner

*Primary Examiner*—Jeffrey S Zweizig
(74) *Attorney, Agent, or Firm*—Harness, Dickey & Pierce, P.L.C.

(57) ABSTRACT

A delay-locked loop (DLL) includes a delay line and a control circuit. The delay line delays an input clock signal based on at least one phase control signal to generate an output clock signal. The at least one phase control signal indicates whether the output clock signal leads or lags the input clock signal. The control circuit generates a division control signal by determining whether the output clock signal is locked with respect to the input clock signal, and generates the at least one phase control signal based on the division control signal. Accordingly, a locking time and bang-bang jitter may be reduced.

30 Claims, 9 Drawing Sheets

ADAPTIVE DELAY-LOCKED LOOPS AND METHODS OF GENERATING CLOCK SIGNALS USING THE SAME

PRIORITY STATEMENT

This non-provisional U.S. patent application claims priority under 35 USC § 119 to Korean Patent Application No. 2006-16499, filed on Feb. 21, 2006 in the Korean Intellectual Property Office (KIPO), the entire contents of which is incorporated herein by reference.

BACKGROUND

Description of the Conventional Art

In conventional semiconductor systems, data is transferred in synchronization with a clock signal, and thus, synchronization between a clock signal and a data signal may be relatively important to the operation and/or function of the system. For example, in a system where a data value is determined at an edge of a clock signal, a phase and a frequency of the clock signal may be controlled so that the edge of the clock signal is located at the center of a data pulse. In synchronous circuits, a phenomenon in which the clock signal is transferred to respective components at different times, is referred to as clock skew. Clock skew may be caused by variations in transmission times for clock signals through a transmission line. Clock skew may also result from a delay during which a clock signal passes through an internal circuit of a chip.

A conventional semiconductor memory device provides an internal clock signal to a plurality of internal circuits using a clock driver having a higher or relatively high driving capability. However, if the plurality of internal circuits receive an external clock signal as an operation clock, clock skew between the external clock signal and the internal clock signal may be as much as a delay time during which the external clock signal passes through the clock driver, and an output of data may be delayed by as much as the delay time. A conventional delay-locked loop (DLL) may detect a phase difference between the external clock signal (or a reference signal) and the internal clock signal, and may compensate for the phase difference so that the internal clock signal is synchronized with the external clock signal.

A DLL may also change the phase of an internal clock signal periodically changed. In one example, a phase difference may be larger at an initial state of operation of a semiconductor device during which the DLL may compensate for the phase difference more coarsely. However, a phase of an output signal of the DLL may not be locked exactly with respect to a reference phase, and as a result, bang-bang jitter may occur. In at least one example, bang-bang jitter may result from the phase of the output signal of the DLL leading or lagging the phase of the reference signal (or the reference phase). If a coarse phase compensation of the output signal continues, bang-bang jitter may increase.

To suppress bang-bang jitter, the operation of a conventional DLL may be divided into two modes. For example, after the DLL operates for a first time interval (e.g., an initial locking mode), the DLL may coarsely compensate for a phase difference. After the first time interval (e.g., during a normal locking mode), the DLL may more finely compensate for the phase difference. In this example, to reduce locking time during the initial locking mode, a phase-update frequency of the DLL may be determined depending on a loop bandwidth of the DLL so that the phase-update frequency is closer to the loop bandwidth of the DLL. The phase-update frequency during the normal locking mode may be lower or substantially lower than the loop bandwidth of the DLL to reduce bang-bang jitter.

Although the operating frequency of a conventional semiconductor circuit may increase, the delay of a circuit receiving an internal clock signal may not decrease, and thus, phase difference may increase. Thus, updating a phase with a phase-update frequency closer to a loop bandwidth of a DLL during an initial locking mode may not be sufficient.

When a clock signal is out of a locked state or unlocked (e.g., when a lock drift occurs), during the normal locking mode, the conventional DLL may update a phase of the clock signal with a smaller or relatively small phase variation and a relatively low phase-update frequency. In this example, more clock cycles may be required to lock the clock signal with respect to the initial locking mode in the conventional DLL.

The DLL may fix a frequency of the clock signal to be less than a loop bandwidth of the DLL to suppress an incorrect phase update. Conventionally, operating frequencies of semiconductor devices increase relative to bandwidths. When a conventional semiconductor device starts to operate, a time during which the DLL locks the internal clock signal may be, for example, several tens of cycles, during which operating integrity of the semiconductor device may decrease.

In a conventional DLL, a phase-update frequency may be limited by the loop bandwidth of the DLL and extending the loop bandwidth of the DLL may be relatively difficult. On the one hand, when coarsely updating locking time may be shortened, but bang-bang jitter may increase. On the other hand, when finely updating, bang-bang jitter may be reduced, but the locking time may increase.

SUMMARY

At least some example embodiments relate to delay-locked loops (DLL) and methods for generating clock signals, for example, DLLs and methods for generating clock signals, which have shorter locking times and/or reduced bang-bang jitter.

At least one example embodiment provides a DLL capable of reducing a locking time and/or bang-bang jitter without restricting a loop bandwidth of the DLL.

At least one other example embodiment provides a method of generating a clock signal capable of reducing a locking time and/or bang-bang jitter without restricting a loop bandwidth of the DLL.

According to at least one example embodiment, a DLL may include a control circuit, a delay line and/or a local clock generator. The control circuit may generate a plurality of phase control signals, which may indicate whether an output clock signal leads or lags an input clock signal. The plurality of phase control signals may be generated in synchronization with a local clock signal. The control circuit may also determine whether the output clock signal is locked with respect to the input clock signal and generate a division control signal based on whether the output clock signal is locked. The delay line may delay the input clock signal based on the plurality of phase control signals to generate the output clock signal. The local clock generator may generate the local clock signal, and may control a generating frequency of the local clock signal based on the division control signal.

According to at least some example embodiments, the control circuit may include a logic circuit. The logic circuit may determine whether the output clock signal is locked based on the plurality of phase control signals. The logic circuit may determine that the output clock signal is in a locked state if a first of the phase control signals is continuously generated more than N (where N is an integer) number of times, and then a second of the plurality of phase control signals is generated. The logic circuit may determine that the output clock signal is in an unlocked state if a first of the phase control signals is generated more than N number of times after the output clock signal is determined to be in the locked state. The control circuit may generate the division control signal having a first logic value when the output clock signal is determined to be in a locked state, and may generate the division control signal having a second logic value when the output clock signal is determined to be in an unlocked state. The local clock generator may generate the local clock signal with a lower or relatively low frequency while the division control signal has the first logic value, and may generate the local clock signal with a higher or relatively high frequency while the division control signal has the second logic value.

According to at least one example embodiment, the delay line may update a phase of the output clock signal with a respective phase variation according to an operating mode of the DLL. The delay line may include a coarse delay line, a selector and an interpolator. The coarse delay line may generate a plurality of coarse delay signals having a relatively large phase variation. The selector may select at least two of the plurality of coarse delay signals to output the selected coarse delay signals. The interpolator may generate the output clock signal having a relatively small phase variation by interpolating the selected coarse delay signals.

According to at least one other example embodiment, the delay line may include a coarse delay line and/or a phase blender. The coarse delay line may generate at least one coarse delay signal having a larger or relatively large phase variation. The phase blender may select one of the coarse delay signal and a plurality of second delay signals delayed from the coarse delay signal by a respective delay time to generate the output clock signal.

In at least one other example embodiment, a DLL may include a delay line and/or a control circuit. The delay line may delay an input clock signal based on a phase control signal to generate an output clock signal. The control circuit may determine whether the output clock signal is locked with respect to the input clock signal, may generate the phase control signal with a first (e.g., relatively low) frequency in a locked state, and may generate the phase control signal with a second (e.g., relatively high) frequency in an unlocked state.

According to at least some example embodiments, the phase control signal may include a first phase control signal and a second phase control signal, and the control circuit may include a logic circuit. The logic circuit may determine a relative phase difference between the input clock signal and the output clock signal based on the first and second phase control signals. The logic circuit may determine whether the output clock signal is in a locked state or an unlocked state with respect to the input clock signal based on the first and second phase control signals to generate a division control signal. The logic circuit may determine that the output clock signal is in a locked state if one of the first and second phase control signals is generated more than N number of times, and then the other of the first and second phase control signals is generated. If the output clock signal is in a locked state, the logic circuit may output the division control signal having a first logic value. The logic circuit may determine that the output clock signal is in an unlocked state if one of the first and second phase control signals is continuously generated more than N number of times after the output clock signal is determined to be in a locked state.

At least one other example embodiment provides a method of generating an output clock signal, for example, using a DLL. According to at least this example embodiment, a plurality of phase control signals may be generated. The plurality of phase control signals may indicate whether the output clock signal leads or lags an input clock signal, and may be in synchronization with a local clock signal. Whether the output clock signal is locked with respect to the input clock signal may be determined based on the plurality of phase control signals. A division control signal may be generated based on whether or not the output clock signal is locked. The local clock signal may be generated by controlling a generating frequency of the local clock signal based on the division control signal. The output clock signal may be generated by delaying the input clock signal based on the plurality of phase control signals.

According to at least some example embodiments, the output clock signal may be determined to be in a locked state when a first of the phase control signals is continuously generated more than N number of times and then a second of the plurality of phase control signals is generated. The output clock signal may be determined to be in an unlocked state when one of the phase control signals is continuously generated more than N number of times after the output clock signal is determined to be in the locked state.

According to at least some example embodiments, the local clock signal may be generated with a frequency lower than a loop bandwidth of the DLL while the division control signal has the first logic value, and may be generated with a frequency higher than the loop bandwidth of the DLL while the division control signal has the second logic value.

At least one other example embodiment provides a method of generating an output clock signal, for example, using a DLL. The DLL may be operable in a coarse locking mode and a fine locking mode, and may update a phase of the output clock signal with a relatively high phase-update frequency and/or a relatively small phase variation while the DLL operates in the fine locking mode.

According to at least some example embodiments, a phase difference between an input clock signal and the output clock signal may be detected to determine that the output clock signal is in a locked state, and the phase of the output clock signal may be updated with a relatively low phase-update frequency and/or a relatively small phase variation while the DLL operates in the fine locking mode. The phase difference between the input clock signal and the output clock signal may be detected to determine that the output clock signal is in a locked state. The relatively high phase-update frequency may be higher than a loop bandwidth of the DLL, and the relatively low phase-update frequency may be lower than the loop bandwidth of the DLL. The phase of the output clock signal may be updated with a relatively high phase-update frequency and/or a relatively large phase variation while the DLL operates in the coarse locking mode. The phase of the output clock signal may be updated with a phase-update frequency higher than a loop bandwidth of the DLL and/or a relatively large phase variation until the output clock signal is determined to be in the locked state, for example, when the phase of the output clock signal is determined to be outside of a first phase difference (e.g., a phase range) and the DLL is in a fine locking mode.

DETAILED DESCRIPTION OF EXAMPLE EMBODIMENTS

Figure 1:
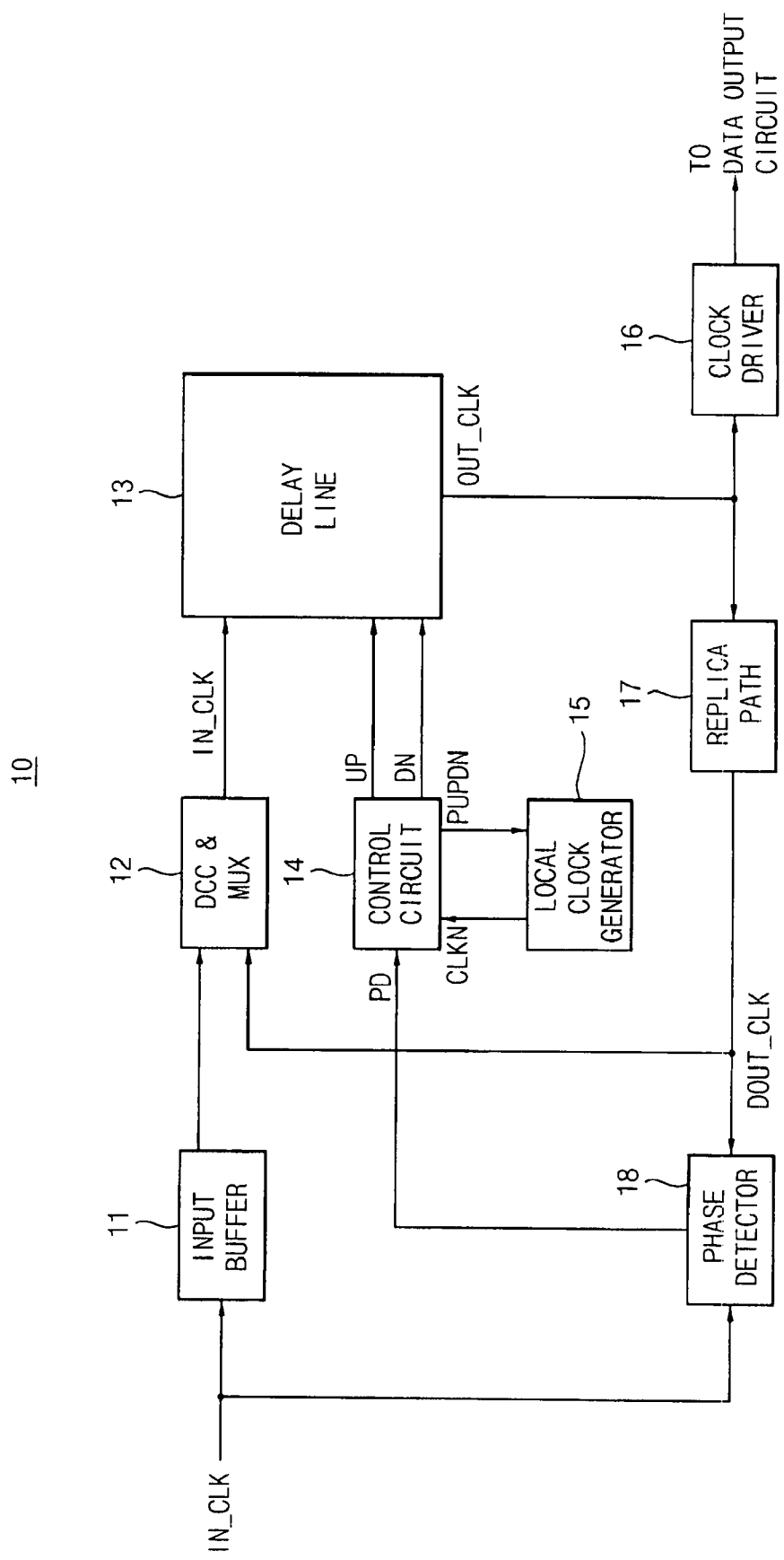
FIG. 1 is a block diagram illustrating a delay-locked loop (DLL) according to an example embodiment.

Example embodiments will now be described more fully with reference to the accompanying drawings, in which example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a delay-locked loop (DLL) according to an example embodiment.

Referring to FIG. 1, the DLL 10 may be a register-controlled DLL, and may include an input buffer 11, a duty cycle corrector and multiplexer (DCC & MUX) 12, a delay line 13, a control circuit (or control logic) 14, a local clock generator 15, a clock driver 16, a replica path 17 and/or a phase detector 18.

Input clock signal IN_CLK may be input to the DCC & MUX 12 through the input buffer 11. The DCC & MUX 12 may receive an output signal of the replica path 17 to modify (or correct) a duty ratio of the input clock signal IN_CLK. In another example embodiment, the DCC & MUX 12 may modify (or correct) the duty ratio of the input clock signal IN_CLK based on an output signal of the DCC & MUX 12 or the delay line 13 instead of the output signal of the replica path 17.

The delay line 13 may generate an output clock signal OUT_CLK, based on output signals UP and DN from the control circuit 14. The output clock signal OUT_CLK may be generated by delaying the input clock signal IN_CLK for a time interval based on output signals UP and DN. According to at least some example embodiments, the delay line 13 may change a phase of the output clock signal OUT_CLK coarsely and/or finely based on an operating mode of the DLL 10. The delay line 13 may output the output clock signal OUT_CLK to the clock driver 16 and the replica path 17.

The clock driver 16 may receive and amplify the output clock signal OUT_CLK, and may output the output clock signal OUT_CLK to another circuit, for example, a data output circuit or other external circuit.

The replica path 17 may delay the output clock signal OUT_CLK to generate a delayed output clock signal DOUT_CLK. For example, the replica path 17 may delay the output clock signal by as much as a time interval corresponding to a time in which the output clock signal OUT_CLK is transferred from the clock driver 16 to the circuit. The delayed output clock signal DOUT_CLK may be output to the phase detector 18.

The phase detector 18 may detect a phase difference between the received input clock signal IN_CLK and delayed output clock signal DOUT_CLK. The phase detector 18 may generate a phase detect signal PD based on the detected phase difference, and output the phase detect signal PD to the control circuit 14.

The control circuit 14 may output phase control signals UP and DN based on at least the phase detect signal PD. For example, the control circuit 14 may output a first phase control signal UP when the delayed output clock signal DOUT_CLK lags the input clock signal IN_CLK, and may output a second phase control signal DN when the delayed output clock signal DOUT_CLK leads the input clock signal IN_CLK. The phase detect signal may be indicative of whether the delayed output clock signal DOUT_CLK leads or lags the input clock signal IN_CLK. The first and second phase control signals UP and DN may be generated as a pulse synchronized with a variable local clock signal CLKN received from the local clock generator 15. The first and second phase control signals UP and DN may be output from the control circuit 14 to the delay line 13.

The control circuit 14 may change a division control signal PUPDN based on whether the output clock signal OUT_CLK is in a locked state or an unlocked state. For example, when one of the phase control signals UP and DN is generated continuously and the other of the phase control signals UP and DN is generated, the control circuit 14 may determine that the output clock signal OUT_CLK is in the locked state. When the output clock signal is in the locked state, the control circuit 14 may generate the division control signal PUPDN having a first state. When the output clock signal OUT_CLK is in the locked state and one of the phase control signals UP and DN is generated continuously more than N number of times, the control circuit 14 may determine that the output clock signal OUT_CLK is in the unlocked state, and the control circuit 14 may generate the division control signal PUPDN having a second state.

The local clock generator 15 may generate the local clock signal CLKN having a variable frequency based on the division control signal PUPDN and/or an operating mode. The operating mode may include a coarse locking mode and a fine locking mode. The local clock generator 15 may output the division control signal PUPDN and the local clock signal CLKN to the control circuit 14. In this example, the local clock generator 15 may generate the local clock signal CLKN having a frequency higher than a loop bandwidth of the DLL 10 when a shorter or relatively short locking time is required. The local clock generator 15 may generate the local clock signal CLKN having a frequency lower than the loop bandwidth of the DLL 10. A maximum value of a frequency of the local clock signal CLKN may be a maximum frequency capable of operating the control circuit 14 normally.

Figure 2:
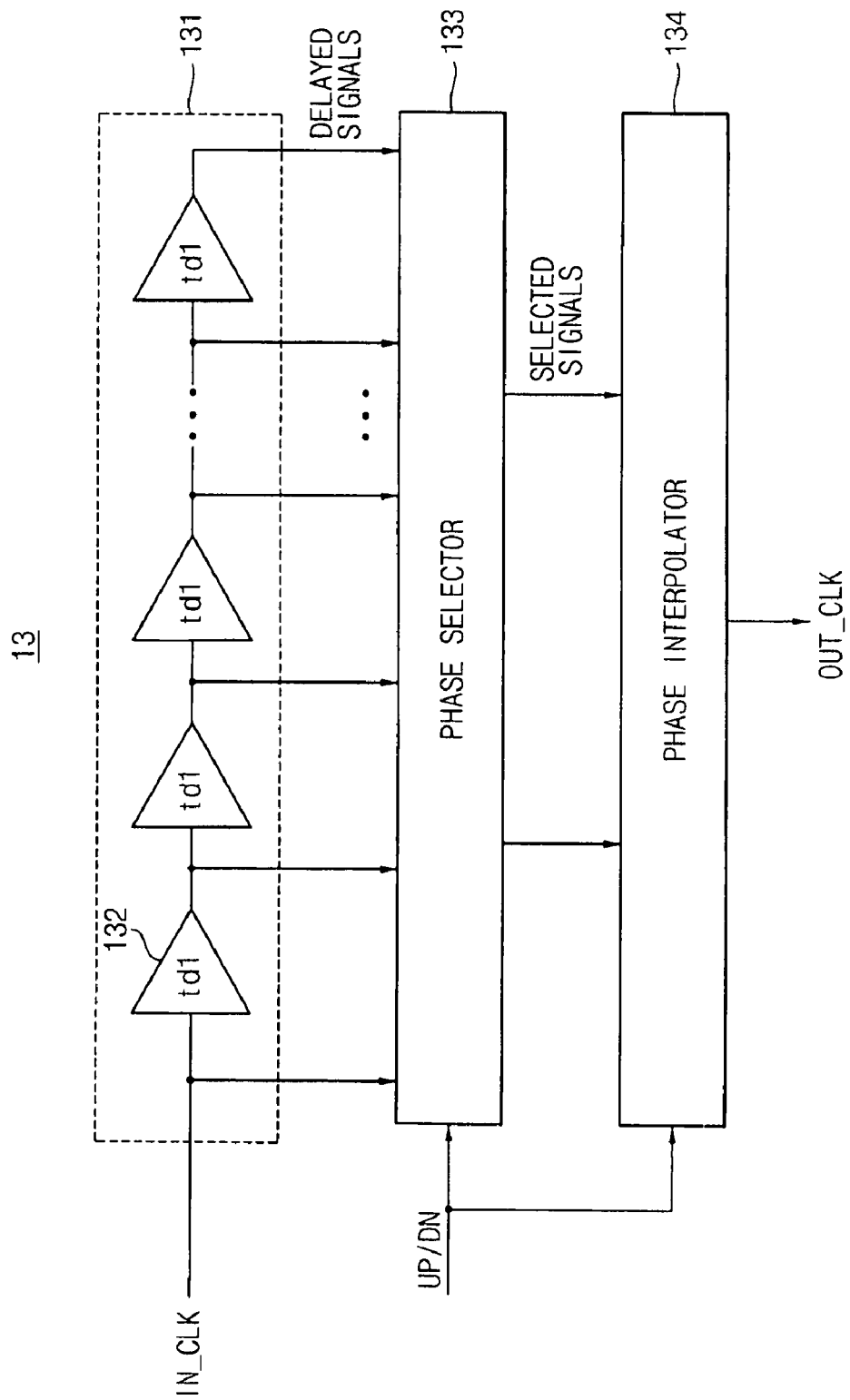
FIG. 2 is a circuit diagram illustrating a delay line of a DLL according to an example embodiment.

FIG. 2 is a circuit diagram illustrating a delay line of a DLL according to an example embodiment.

Referring to FIG. 2, the delay line 13 may include a coarse delay line 131, a phase selector 133 and/or a phase interpolator 134. The coarse delay line 131 may include a plurality of delay cells 132, which may be coupled in series (e.g., serially coupled to each other). Each delay cell 132 may have a delay time td1. The coarse delay line 131 may be implemented with a tapped delay line capable of outputting delayed signals at respective taps between the plurality of delay cells 132. The coarse delay line 131 may provide a plurality of delay signals to the phase selector 133. The phase selector 133 may receive the phase control signals UP/DN from the control circuit 14, and may select at least two of the plurality of delay signals based on the phase control signals UP/DN. The selected signals may be output from the phase selector 133 to the phase interpolator 134.

The phase interpolator 134 may receive the phase control signals UP/DN from the control circuit 14, and may generate a composite signal using phase-interpolation based on the phase control signals UP/DN and the selected signals. For example, the phase interpolator 134 may composite the selected signals using phase interpolation based on phase control signals UP/DN. The composite signal may be output as the output clock signal OUT_CLK.

Figure 3:
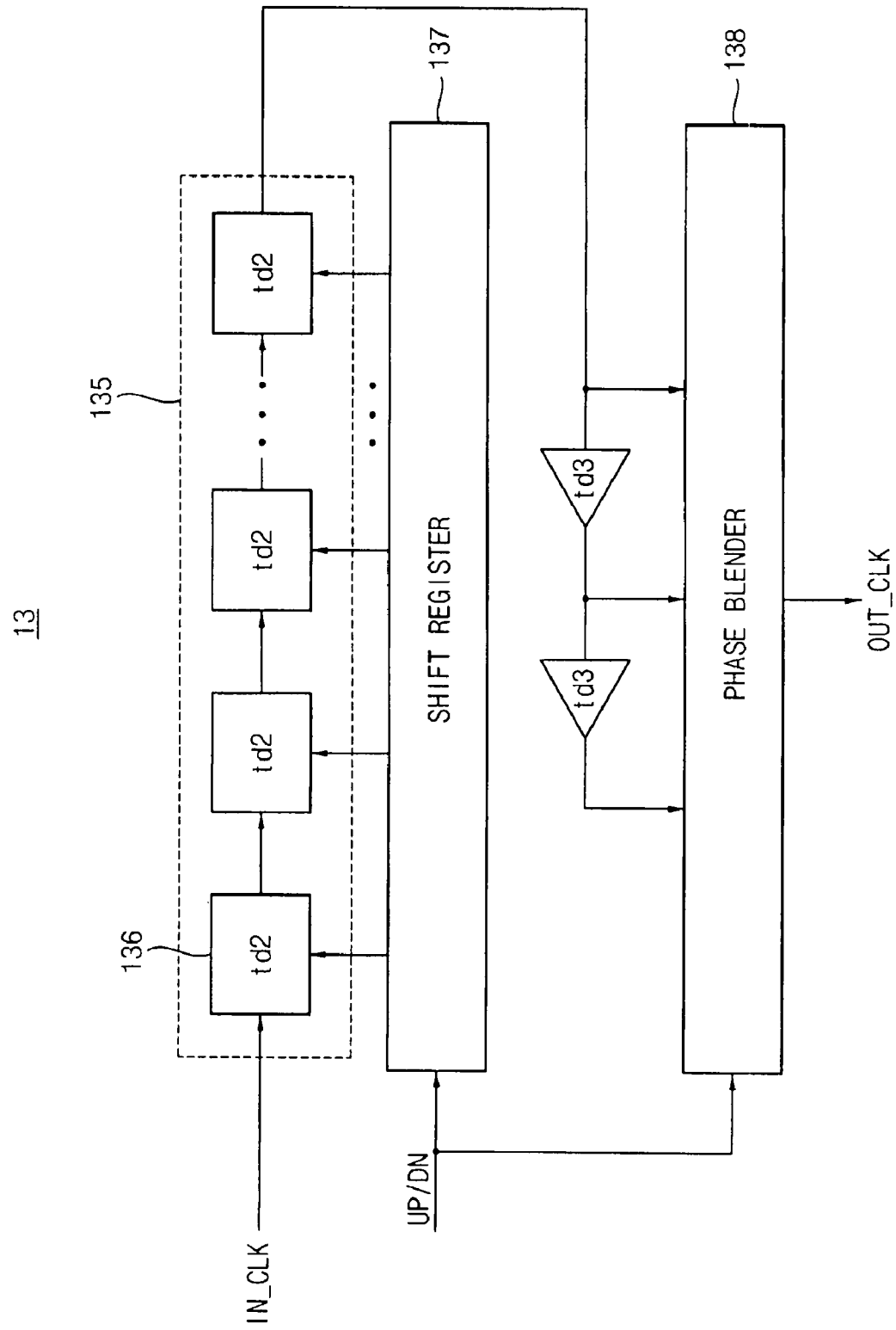
FIG. 3 is a block diagram illustrating a delay line of a according to another example embodiment.

FIG. 3 is a block diagram illustrating a delay line of a DLL according to another example embodiment.

Referring to FIG. 3, the delay line 13 may include a coarse delay line 135, a shift register 137 and/or a phase blender 138. The coarse delay line 135 may have a plurality of delay cells 136 connected in series. Each of the plurality of delay cells 136 may have a delay time td2. The coarse delay line 135 may generate a coarsely delayed output signal. The shift register 137 may determine a delay time of the output signal from the coarse delay line 135 based on the phase control signals UP/DN. The phase blender 138 may generate an output clock signal OUT_CLK, which is more finely delayed using the output signal of the coarse delay line 135.

For example, the output signal from the coarse delay line 135 may be delayed by a respective delay time td3 to generate a plurality of (e.g., at least two or three) delay signals. The phase blender 138 may generate the output clock signal OUT_CLK by phase-interpolating the plurality of delay signals.

Figure 4:
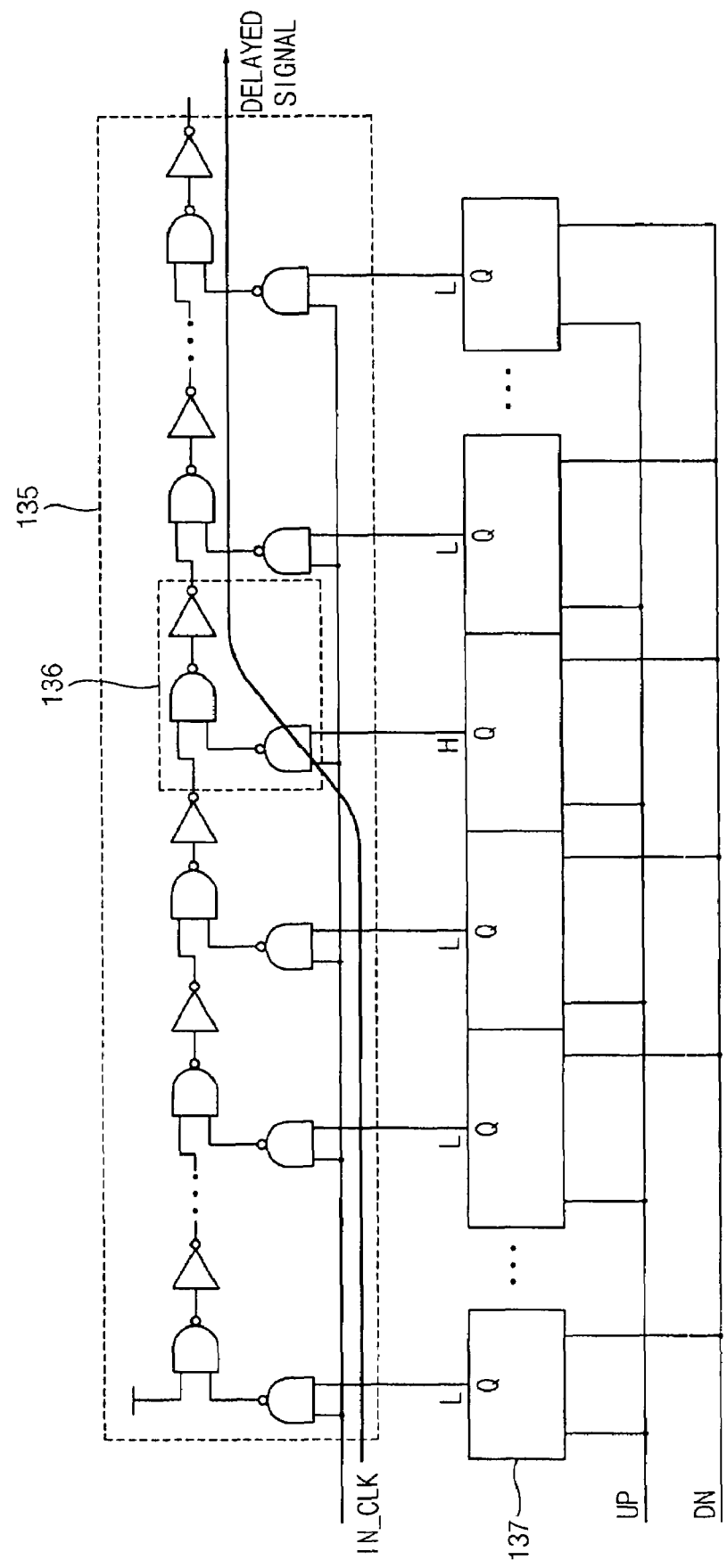
FIG. 4 is a circuit diagram illustrating the delay line of FIG. 3 in more detail.

FIG. 4 is a circuit diagram illustrating the delay line of FIG. 3 in more detail. Referring to FIG. 4, a delay cell 136 may be selected based on an output from shift register 137. For example, delay cell 136 may be selected in response to a logic signal (e.g., a logic high) output from the shift register 137. A delay path of an input clock signal IN_CLK may be determined based on the selected delay cell 136. In FIG. 4, the delay path of the input clock signal IN_CLK is referenced by a thick arrow. Data of the shift register 137 may be shifted based on the phase control signals UP and DN to control a delay time of the input clock signal IN_CLK.

Figure 5:
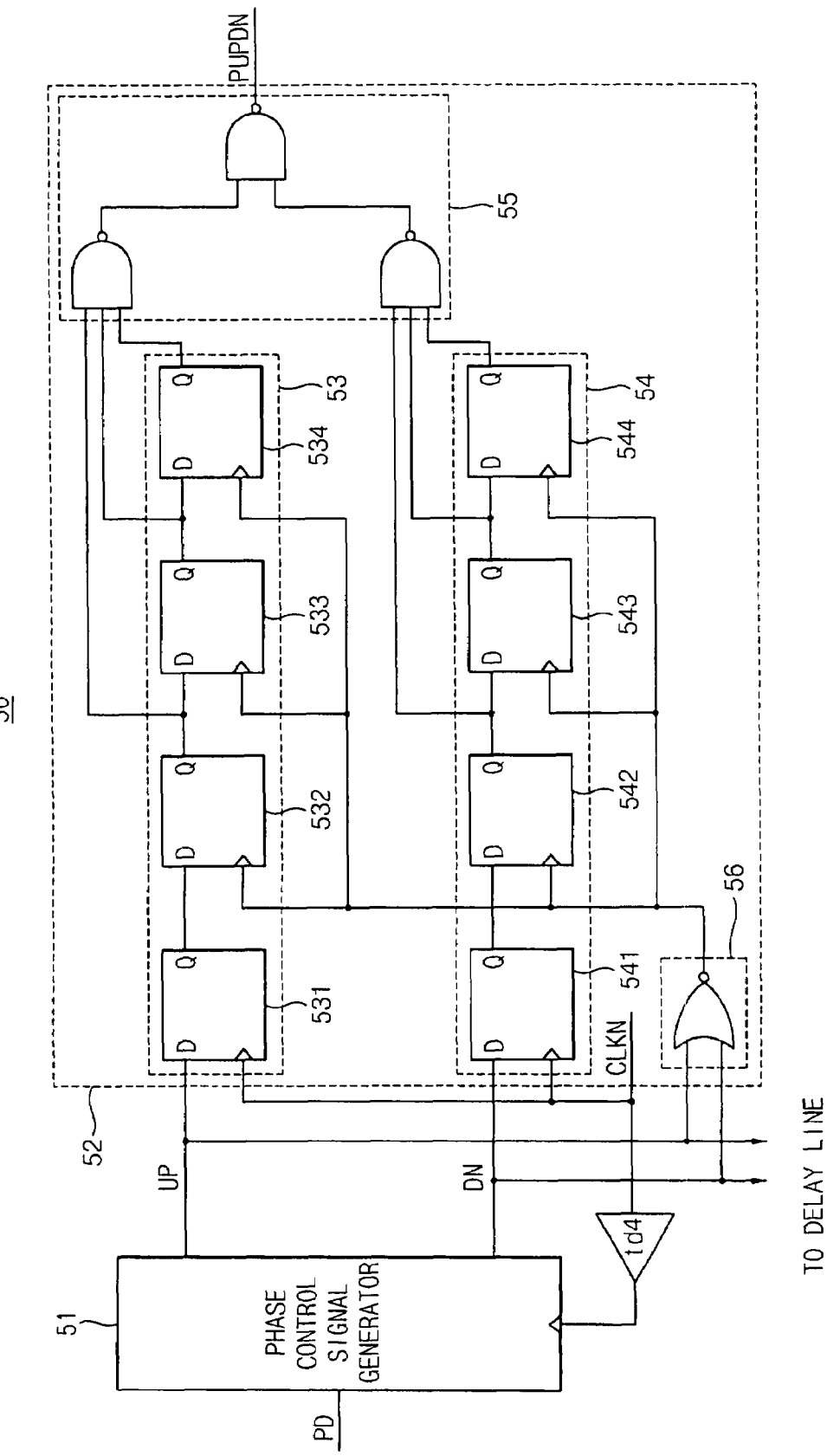
FIG. 5 is a circuit diagram illustrating a control circuit of a DLL according to an example embodiment.

FIG. 5 is a circuit diagram illustrating a control circuit of a DLL according to an example embodiment.

Referring to FIG. 5, the control circuit 50 may include a phase control signal generator 51 and a logic circuit 52. The logic circuit 52 may include a first register 53, a second register 54, a first logic unit 55 and/or a second logic unit 56.

The phase control signal generator 51 may receive a phase detect signal PD, and generate a first phase control signal UP or a second phase control signal DN according to, or based on, a logic state of the phase detect signal PD. The first and second phase control signals UP and DN may be pulse signals having a duty ratio less than one. The first and second phase control signals UP and DN may be provided to the first and second registers 53 and 54 in the logic circuit 52. The phase control signal generator 51 may operate in synchronization with a signal delayed from a clock signal CLKN for a time interval td4 so that the first and second phase control signals UP and DN may be transferred to the first and second registers 53 and 54 without error.

The first register 53 may include a plurality of flip-flops (e.g., D flip-flops) 531, 532, 533 and/or 534 connected in series (e.g., serially coupled to each other). The second register 54 may include a plurality of flip-flops (e.g., D flip-flops) 541, 542, 543 and/or 544 coupled in series (e.g., serially coupled to each other). The number of the D flip-flops may depend on how many continuous phase control signals UP and DN need to be detected. For example, the control circuit 50 of FIG. 5 may detect a case where one of the phase control signals UP and DN is generated continuously three times using four D flip-flops.

In example operation, the D flip-flops 531 and 541 may receive the first and second phase detect signals UP and DN (e.g., directly) from the phase control signal generator, and may operate in synchronization with the clock signal CLKN. The clock signal CLKN may correspond to a local clock signal CLKN in FIG. 1.

The D flip-flops 532, 533, 534, 542, 543 and/or 544 may operate in synchronization with an output signal of the second logic circuit 56. The first and second phase control signals UP and DN may be pulse signals, and may not have different values (e.g., may not have concurrent high logic values). The second logic circuit 56 may perform a NOR operation on the first and second phase control signals UP and DN to generate an output pulse signal when one of the first and second phase control signals UP and DN is generated. The D flip-flops 532, 533, 534, 542, 543 and/or 544 may transfer stored data to the next D flip-flop when one of the first and second phase control signals UP and DN is input based on the output pulse signal.

The first logic circuit 55 may receive data from the D flip-flops 532, 533, 534, 542, 543 and 544, to change a logic value of the division control signal PUPDN when the data corresponding to one of the first and second phase control signals UP and DN has a logic high value. Thus, when the first phase control signal UP is continuously generated three times or the second phase control signal DN is continuously generated three times, a logic value of the division control signal PUPDN may be changed.

The control circuit 50 may detect the continuous phase control signals UP and DN to determine whether the output clock signal is locked, and may control a frequency of the phase control signals UP and DN. The phase control signals UP and DN may control a phase of the output clock signal.

For example, when one of the phase control signals UP and DN is continuously generated more than three times, the division control signal PUPDN may become a logic high, and the local clock generator 15 in FIG. 1 may generate the local clock signal CLKN with a frequency higher than a loop bandwidth of the DLL 10. In this example, the phase control signal generator 51 may generate the phase control signals UP and DN with a relatively high frequency. When the other of the phase control signals UP and DN is generated, the division control signal PUPND may become a logic low and the local clock generator 15 in FIG. 1 may generate the local clock signal CLKN with a frequency lower than the loop bandwidth of the DLL 10. In this case, the phase control signal generator 51 may generate the phase control signals UP and DN with a relatively low frequency.

Figure 6:
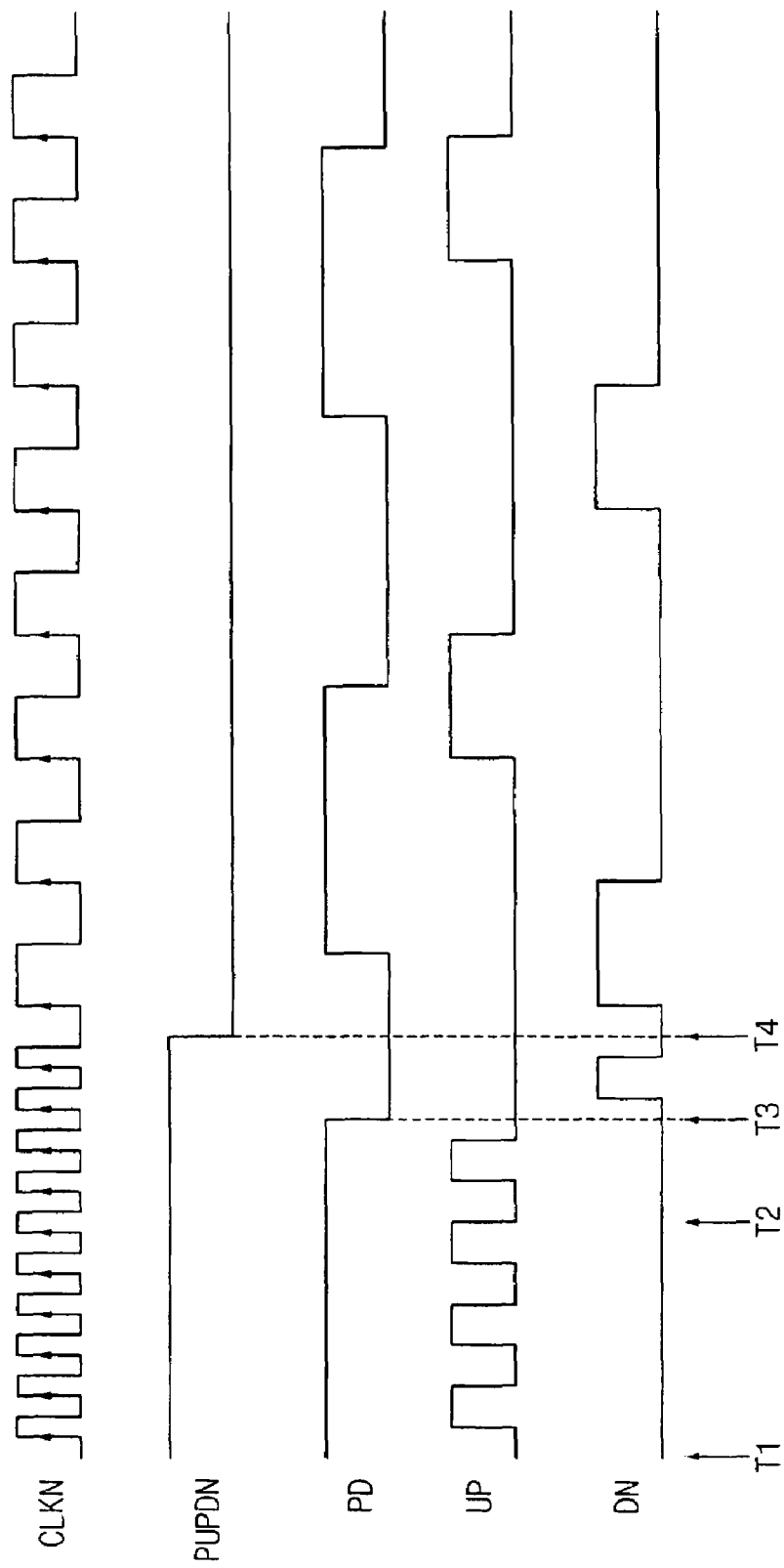
FIG. 6 is a timing diagram illustrating an example operation of the control circuit in FIG. 5 when an output clock signal of a DLL is in a locked state.

FIG. 6 is a timing diagram illustrating example operation of the control circuit in FIG. 5 when an output clock signal of a DLL is in a locked state.

Referring to FIG. 6, the local clock signal CLKN, the control signal PUPDN, the phase detect signal PD, the first phase control signal UP and the second phase control signal DN are shown.

If an output clock signal OUT_CLK of the DLL lags an input clock signal IN_CLK of the DLL at T1, a phase of the output clock signal OUT_CLK may be shifted ahead to have the same or substantially the same phase as (e.g., be in-phase with) the input clock signal IN_CLK at T2. However, the phase detect signal PD may not change immediately or instantaneously at T2. Between T1 and T3, the phase detect signal PD may be a logic high indicating that the output clock signal OUT_CLK lags the input clock signal IN_CLK, and the first phase control signal UP may be generated continuously. In this example, the division control signal PUPDN may become a logic high, the local clock signal CLKN has a relatively high frequency, and the first phase control signal UP may be generated with a relatively high frequency.

At T3, the phase detect signal PD may change to a logic low indicating the output clock signal OUT_CLK leads the input clock signal IN_CLK. After the second phase control signal DN is generated, the control circuit 50 may determine that the output clock signal OUT_CLK is locked to change the division control signal PUPDN to a logic low at T4.

After T4, for example, when a logic value of the division control signal PUPDN is changed, a frequency of the local clock signal CLKN may decrease. A phase of the output clock signal OUT_CLK may not have the same phase as the input clock signal IN_CLK so that a logic value of the phase detect signal PD may change to a relatively low frequency, and the first and second phase control signals UP and DN may be generated with a relatively low frequency. Thus, bang-bang jitter in the output clock signal OUT_CLK may be reduced and/or minimized.

Figure 7:
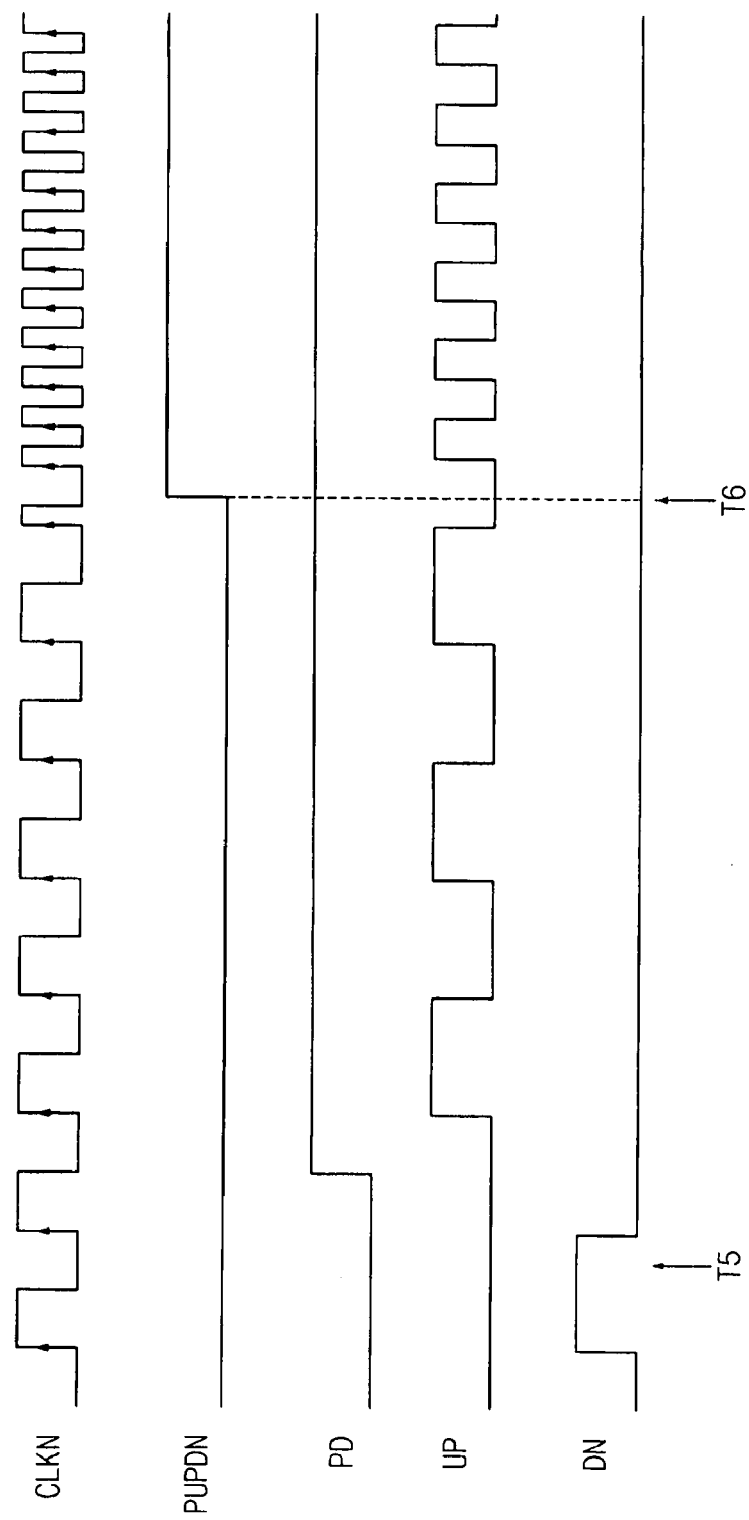
FIG. 7 is a timing diagram illustrating an example operation of the control circuit in FIG. 5 when output clock signal of a DLL is in an unlocked state.

FIG. 7 is a timing diagram illustrating example operation of the control circuit in FIG. 5 when an output clock signal of a DLL is in an unlocked state.

Referring to FIG. 7, the local clock signal CLKN, the division control signal PUPDN, the phase detect signal PD, the first phase control signal UP and the second phase control signal DN are shown. When the output clock signal OUT_CLK of the DLL is in an unlocked state and lags an input clock signal IN_CLK of the DLL at T5, the phase detect signal PD may change to a logic high, and the first phase control signal UP may be generated at a next pulse of the local clock signal CLKN. Between T5 and T6, the first phase control signal UP may be continuously generated more than N (e.g., where N=3) number of times. The control circuit 50 may determine that the output clock signal OUT_CLK is in an unlocked state and may change the division control signal PUPDN to a logic high.

After T6, when a logic value of the division control signal PUPDN is changed, a frequency of the local clock signal CLKN may increase, and the first phase control signal UP may be generated with a relatively high frequency. Thus, a phase of the output clock signal may be updated more rapidly.

Each point of time in FIG. 6 and FIG. 7 may be related to points of time in FIG. 8 as follows.

Figure 8:
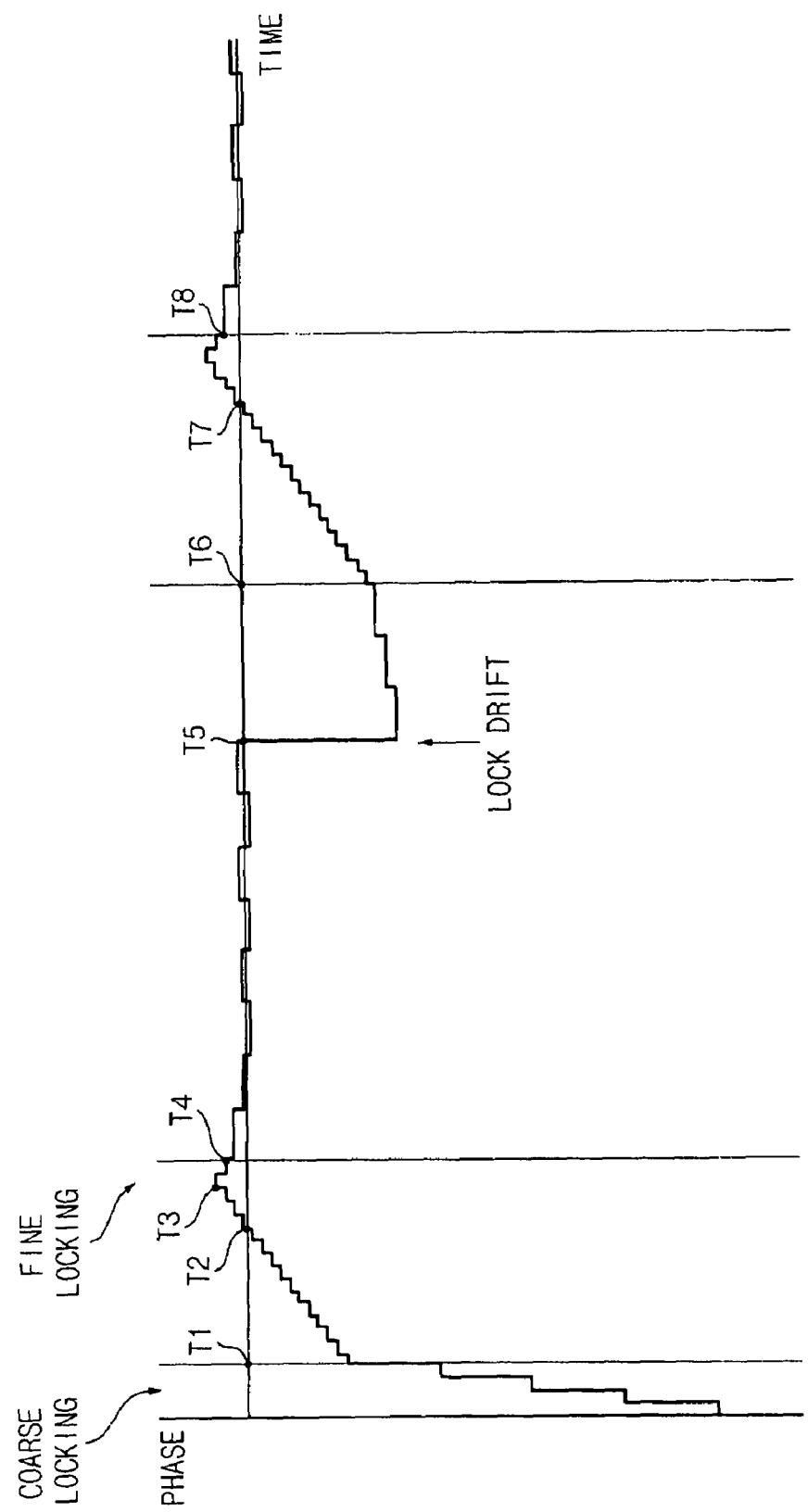
FIG. 8 is a timing diagram illustrating an example operation of a DLL according to an example embodiment.

FIG. 8 is a timing diagram illustrating an example operation of a DLL according to an example embodiment.

Referring to FIG. 8, a horizontal axis indicates time and a vertical axis indicates a relative phase difference between an input clock signal IN_CLK and an output clock signal OUT_CLK. The DLL may update a phase of the output clock signal OUT_CLK according to whether the output clock signal OUT_CLK leads or lags the input clock signal IN_CLK. In addition, the DLL may detect whether the phase of the output clock signal OUT_CLK is in a locked state or an unlocked state, to control a phase-update frequency of the output clock signal OUT_CLK.

For example, the DLL may shift the phase of the output clock signal OUT_CLK based on the first and second phase control signals UP and DN, which correspond to a case where the output clock signal OUT_CLK leads or lags the input clock signal IN_CLK. In addition, the DLL may change a logic value of the division control signal PUPDN according to whether the phase of the output clock signal OUT_CLK is in the locked state or the unlocked state, and may control an updating frequency of the phase of the output clock signal OUT_CLK to be higher or lower than a loop bandwidth of the DLL based on the logic value of the division control signal PUPDN.

A first interval after the DLL begins to operate may correspond to an initial locking mode. During the first interval, the DLL may operate in a coarse locking mode. The output clock signal OUT_CLK may lag the input clock signal IN_CLK so that the DLL may update the phase of the output clock signal OUT_CLK with a larger phase variation and/or a frequency higher than a loop bandwidth of the DLL. The initial locking mode may continue during which a condition, for example, a time, a phase variation or the like is satisfied.

At T1, the DLL may enter a normal locking mode and the DLL may operate in a fine locking mode. In the fine locking mode, the DLL may update the phase of the output clock signal OUT_CLK with a smaller or relatively small phase variation.

Between T1 and T3, the DLL may update the phase of the output clock signal OUT_CLK with a smaller or relatively small phase variation and/or a frequency higher than the loop bandwidth of the DLL. At T2, the phase of the output clock signal OUT_CLK may become the same or substantially the same as the phase of the input clock signal IN_CLK. At T3, the phase of the output clock signal OUT_CLK may be delayed. For example, before T3, the first phase control signal UP may be continuously generated so that the phase of the output clock signal OUT_CLK advances continuously. After T3, the second phase control signal DN may be generated to delay the phase of the output clock signal OUT_CLK.

Although the phase of the output clock signal OUT_CLK may become the same or substantially the same as the phase of the input clock signal IN_CLK at T2, the first phase control signal UP may be output until T3. During the interval from T1 to T3, the first phase control signal UP may be generated with a frequency higher than the loop bandwidth of the DLL. However, the DLL may detect a phase inversion with a lower or relatively low frequency. Thus, the phase of the output clock signal OUT_CLK may continuously advance the phase of the input clock signal IN_CLK until the DLL detects a phase inversion, to generate the second phase control signal DN.

Referring back to the DLL 10 of FIG. 1, according to at least one example embodiment, the phase detector 18 may filter (e.g., perform digital low-pass filtering of) a signal of a phase difference between two clock signals so that the phase detect signal PD may be updated with a lower or relatively low frequency and at least some delay. However, the phase control signals UP and DN may be output with a frequency higher than the loop bandwidth of the DLL. Thus, the control circuit 14 in FIG. 1 may continuously output a phase control signal until a logic value of the phase detect signal PD is changed.

Referring to FIGS. 6 through 8, the first phase control signal UP may be continuously generated beginning at T1 in FIG. 8, the phase of the output clock signal OUT_CLK may be inversed at T2 in FIGS. 6 and 8, and the second phase control signal DN may be generated at T3 in FIGS. 7 and 8. The DLL may determine that the phase of the output clock signal OUT_CLK is in a locked state, and the division control signal PUPDN may become a logic low at T4.

Referring again to FIG. 8, during a third interval, the DLL may update the phase of the output clock signal OUT_CLK with a smaller or relatively small phase variation and/or a frequency lower than the loop bandwidth of the DLL. During the third interval, the output clock signal OUT_CLK may repeat leading and lagging of the input clock signal IN_CLK with a smaller or relatively small phase variation so that bang-bang jitter may be reduced.

During a locked state, the logic value of the division control signal PUPDN may remain unchanged. For example, the control circuit 14 in FIG. 1 may alternately generate the first and second phase control signals UP and DN, so that although the phase control signals UP and DN are counted, the division control signal PUPDN may not be generated.

Referring back to FIGS. 7 and 8, the output clock signal OUT_CLK may be out of the locked state at T5, causing lock drift. After T5, the phase of the output clock signal OUT_CLK may be updated with a smaller or relatively small phase variation and/or a frequency lower than the loop bandwidth of the DLL. The DLL may detect that the output clock signal OUT_CLK enters an unlocked state at T6. For example, when the first phase control signal UP is continuously generated, the control circuit 14 in FIG. 1 may determine that the output clock signal OUT_CLK has entered the unlocked state to change the logic value of the division control signal PUPDN. As the logic value of the division control signal PUPDN is changed, the phase of the output clock signal OUT_CLK may be updated with a frequency higher than the loop bandwidth of the DLL.

After T6, during a fourth interval, the DLL may update the phase of the output clock signal OUT_CLK with a smaller or relatively small phase variation and/or a frequency higher than the loop bandwidth of the DLL based on the logic value of the division control signal PUPDN.

In another example embodiment, when the phase of the output clock signal OUT_CLK is out of a specific, desired or particular phase variation, the DLL may enter the initial locking mode to update the phase of the output clock signal OUT_CLK with a larger or relatively larger phase variation.

Similarly during the second interval, the phase of the output clock signal OUT_CLK may become the same or substantially the same as the phase of the input clock signal IN_CLK at T7, and the phase of the output clock signal OUT_CLK may be delayed at T8. The DLL may detect that the phase of the output clock signal OUT_CLK is further advanced than the phase of the input clock signal IN_CLK at T7, which may be the same or substantially the same as T3. The DLL may detect that the phase of the output clock signal OUT_CLK is in a locked state at T8, which may be the same or substantially the same as T4.

After T8, during a fifth interval, the DLL may be return to the locked state, and may update the phase of the output clock signal OUT_CLK with a smaller or relatively small phase variation and/or a frequency lower than the loop bandwidth of the DLL, in the same or substantially the same manner as during the third interval. The DLL may repeat the above operations to maintain the locked state.

Figure 9:
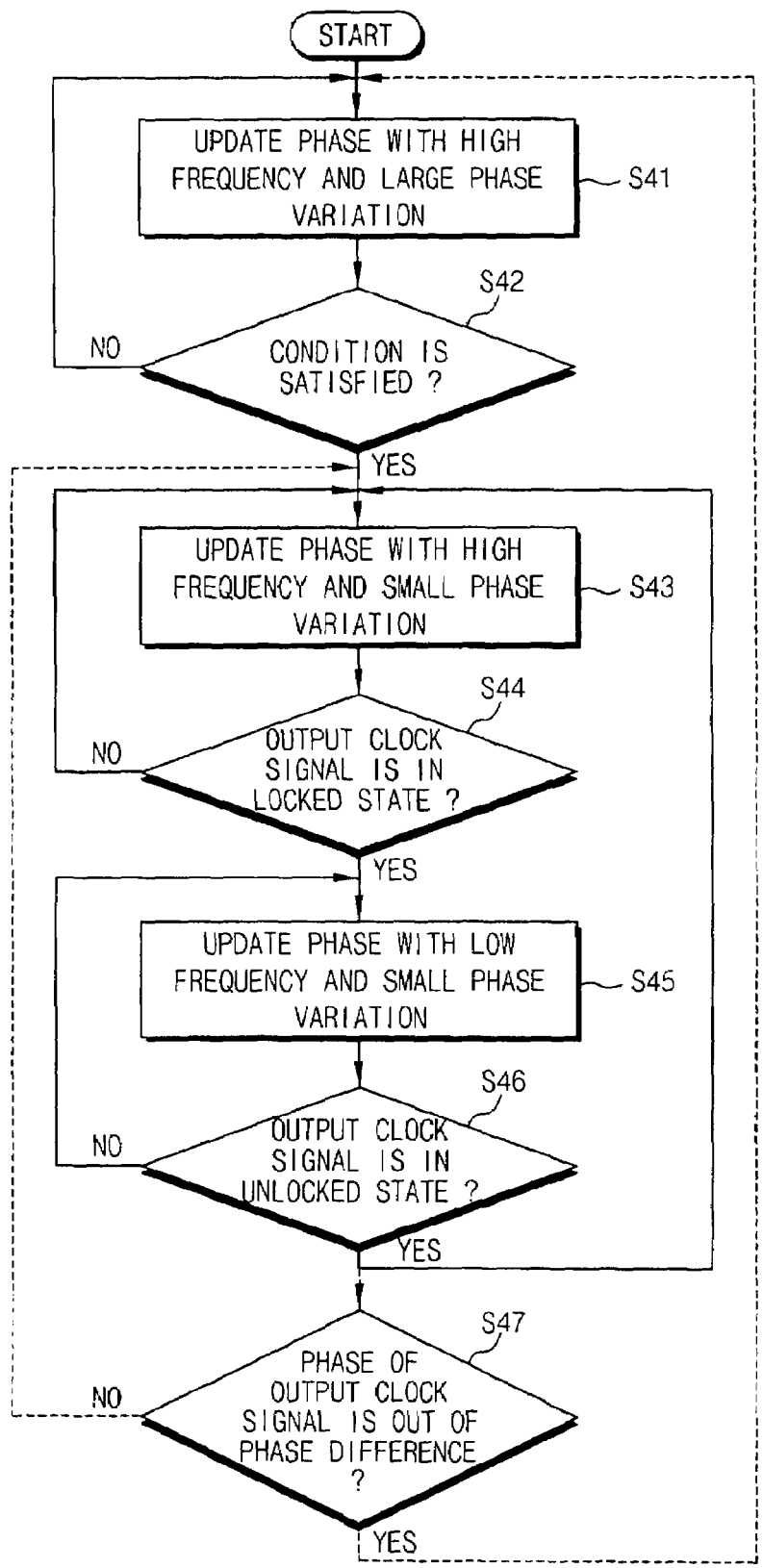
FIG. 9 is a flow chart illustrating a method for generating an output clock signal according to an example embodiment.

FIG. 9 is a flow chart illustrating a method for generating an output clock signal according to an example embodiment.

Referring to FIG. 9, the operation of the DLL may be divided into an initial locking mode and a normal locking mode.

After the DLL starts to operate, during the initial locking mode, the DLL may operate in a coarse locking mode, and a phase of the output clock signal OUT_CLK may be updated with a larger or relatively large phase variation and/or a frequency higher than a loop bandwidth of the DLL (S41). For example, with regard to FIG. 1, the DLL 10 may update the phase of the output clock signal OUT_CLK from the delay line 13 based on the local clock signal CLKN having a higher or relatively high frequency.

S41 may be repeated until a desired or particular condition is satisfied, for example, a first time interval elapses, a phase difference is reduced to less than a reference phase variation, or the like (S42). After the condition is satisfied, the DLL may enter the normal locking mode.

During the normal locking mode, the DLL may operate in a fine locking mode, the phase of the output clock signal OUT_CLK may be updated with a smaller or relatively small phase variation and/or a frequency higher than the loop bandwidth of the DLL, and the DLL may continuously detect a phase difference between the input clock signal IN_CLK and the output clock signal OUT_CLK (S43). For example, referring again to FIG. 1, in the DLL 10, the phase of the output clock signal OUT_CLK from the delay line 13 may be updated more quickly based on the local clock signal CLKN having a higher or relatively high frequency, and the phase difference between the input clock signal IN_CLK and the output clock signal OUT_CLK may be detected based on changes of the phase control signals UP and DN from the control circuit 14.

S43 may be repeated until the DLL determines that the phase of the output clock signal OUT_CLK is the same or substantially the same as the phase of the input clock signal IN_CLK, (e.g., the output clock signal OUT_CLK is in a locked state, S44). For example, the DLL 10 may determine that the output clock signal OUT_CLK is in the locked state when one of the phase control signals UP and DN is continuously generated and the other of the phase control signal UP and DN is also generated.

After the DLL determines that the output clock signal OUT_CLK is in the locked state (S44), the phase of the output clock signal OUT_CLK may be updated with a smaller or relatively small phase variation and/or a frequency lower than the loop bandwidth of the DLL, and the DLL may continuously detect the phase difference between the input clock signal IN_CLK and the output clock signal OUT_CLK (S45). S45 may be repeated until the DLL determines that the phase difference between the input clock signal IN_CLK and the output clock signal OUT_CLK is more than a particular reference phase variation, (e.g., the output clock signal OUT_CLK is unlocked, S46). For example, when two phase control signals UP and DN are alternately generated, the DLL 10 may determine that the output clock signal OUT_CLK is being maintained in the locked state. On the contrary, when one of the phase control signals UP and DN is continuously generated more than a number of times, the DLL 10 in FIG. 1 may determine that the output clock signal OUT_CLK is in an unlocked state.

When the DLL determines that the output clock signal is the unlocked state (S46), the process in FIG. 9 may return to S43 and repeat. Thus, the DLL may update the phase of the output clock signal OUT_CLK with a smaller or relatively small phase variation and/or a frequency higher than the loop bandwidth of the DLL.

When the phase of the output clock signal OUT_CLK is out of a phase difference (S47), the process may return to S41 and repeat. Thus, the DLL may update the phase of the output clock signal OUT_CLK with a larger or relatively large phase variation and/or a frequency higher than the loop bandwidth of the DLL.

As mentioned above, a DLL and a method of generating an output clock signal using the DLL according to example embodiments may update a phase of an output clock signal with a larger or relatively large phase variation and/or a frequency higher than a loop bandwidth of the DLL during an initial locking mode, may update the phase of the output clock signal with a smaller or relatively small phase variation and/or a frequency higher than the loop bandwidth of the DLL during a normal locking mode, and/or may update the phase of the output clock signal with a smaller or relatively small phase variation and/or a frequency lower than the loop bandwidth of the DLL during a locking mode, so that a locking time may be shortened and/or bang-bang jitter may be reduced.

While example embodiments have been described in detail, it should be understood that various changes, substitutions and alterations may be made herein without departing from the scope of the present invention.

What is claimed is:

1. A delay-locked loop (DLL) comprising:
   a delay line configured to delay an input clock signal based on at least one phase control signal to generate an output clock signal, the at least one phase control signal indicating whether the output clock signal leads or lags the input clock signal; and
   a control circuit configured to generate a division control signal by determining whether the output clock signal is locked with respect to the input clock signal, and configured to generate the at least one phase control signal based on the division control signal.

2. The DLL of claim 1, further comprising,
   a local clock generator configured to generate a local clock signal by controlling a frequency of the local clock signal based on the division control signal,
   wherein the control circuit generates the at least one phase control signal in synchronization with the local clock signal.

3. The DLL of claim 2, wherein the control circuit includes,
   a logic circuit configured to determine whether the output clock signal is locked based on the at least one phase control signal.

4. The DLL of claim 3, wherein the logic circuit determines the output clock signal is in a locked state when a first of the at least one phase control signal is continuously generated more than N number of times and then another of the at least one phase control signal is generated subsequent to the continuous generation of the first phase control signal N number of times.

5. The DLL of claim 3, wherein the logic circuit determines the output clock signal is in an unlocked state when a first of the at least one phase control signal is continuously generated more than N number of times after the output clock signal is determined to be in a locked state.

6. The DLL of claim 2, wherein the control circuit generates the division control signal having a first logic value when the output clock signal is determined to be in a locked state, and generates the division control signal having a second logic value when the output clock signal is determined to be in an unlocked state.

7. The DLL of claim 6, wherein the local clock generator generates the local clock signal with a first frequency while the division control signal has the first logic value, and generates the local clock signal with a second frequency while the division control signal has the second logic value, the first frequency being lower than the second frequency.

8. The DLL of claim 6, wherein the local clock generator generates the local clock signal with a frequency lower than a loop bandwidth of the DLL while the division control signal has the first logic value, and generates the local clock signal with a frequency between the loop bandwidth of the DLL and a maximum operating frequency of the control circuit while the division control signal has the second logic value.

9. The DLL of claim 1, wherein the delay line is further configured to update a phase of the output clock signal with a respective phase variation according to an operating mode of the DLL.

10. The DLL of claim 1, wherein the delay line includes,
    a coarse delay line configured to generate a plurality of coarse delay signals having a first phase variation,
    a selector configured to select at least two of the plurality of coarse delay signals to output the selected coarse delay signals, and
    an interpolator configured to generate the output clock signal having a second phase variation by interpolating the selected coarse delay signals, the second phase variation being less than the first phase variation.

11. The DLL of claim 1, wherein the delay line includes,
    a coarse delay line configured to generate one coarse delay signal having a first phase variation, and
    a phase blender configured to generate the output clock signal by select one of the coarse delay signal and a plurality of second delay signals delayed for a respective delay time from the coarse delay signal.

12. The DLL of claim 1, wherein the control circuit is further configured to control a generation frequency of the at least one phase control signal based on the division control signal.

13. The DLL of claim 12, wherein the control circuit generates the at least one phase control signal with a first frequency when the division control signal indicates the output clock signal is in a locked state, and generates the at least one phase control signal with a second frequency when the division control signal indicates the output clock signal is in an unlocked state, the first frequency being lower than the second frequency.

14. The DLL of claim 12, wherein the control circuit includes,
a logic circuit configured to determine a phase difference between the input clock signal and the output clock signal based on a first phase control signal and a second phase control signal, the at least one phase control signal including the first and second phase control signals.

15. The DLL of claim 14, wherein the logic circuit determines whether the output clock signal is in a locked state or an unlocked state with respect to the input clock signal based on a generation sequence of the first and second phase control signals to generate the division control signal.

16. The DLL of claim 15, wherein the logic circuit determines the output clock signal is in a locked state when one of the first and second phase control signals is continuously generated more than N number of times and then another of the first and second phase control signals is generated, the logic circuit outputting the division control signal having a first logic value if the output clock signal is determined to be in a locked state.

17. The DLL of claim 15, wherein the logic circuit determines that the output clock signal is in an unlocked state when one of the first and second phase control signals is continuously generated more than a N number of times after the output clock signal is determined to be in a locked state, the logic circuit outputting the division control signal having a second logic value if the if the output clock signal is determined to be in an unlocked state.

18. The DLL of claim 17, wherein the logic circuit is configured to perform a logical NAND operation on a number of the first phase control signals to obtain a first result, perform a logical NAND operation on a number of the second phase control signals to obtain a second result, and perform a logical NAND operation on the first and second results to generate the division control signal.

19. The DLL of claim 14, wherein the control circuit is configured to generates the first and second phase control signals with a frequency between a loop bandwidth of the DLL and a maximum operating frequency of the control circuit when the division control signal indicates the output clock signal is in a locked state, and the control circuit is configured to generate the first and second phase control signals with a frequency lower than the loop bandwidth of the DLL when the division control signal indicates the output clock signal is in an unlocked state.

20. A method of generating an output clock signal, the method comprising:
delaying an input clock signal based on at least one phase control signal to generate an output clock signal, the at least one phase control signal indicating whether the output clock signal leads or lags the input clock signal;
generating a division control signal by determining whether the output clock signal is locked with respect to the input clock signal; and
generating the at least one phase control signal based on the division control signal.

21. The method of claim 20, further including,
generating a local clock signal by controlling a frequency of the local clock signal based on the division control signal,
wherein the at least one phase control signal is generated in synchronization with the local clock signal.

22. The method of claim 21, wherein the output clock signal is determined to be in a locked state when a first of the at least one phase control signal is continuously generated more than N number of times and then a second of the at least one phase control signal is generated.

23. The method of claim 21, wherein the output clock signal is determined to be in an unlocked state when a first of the at least one phase control signal is continuously generated more than N number of times after the output clock signal is determined to be in a locked state.

24. The method of claim 21, wherein generating the division control signal includes,
generating the division control signal having a first logic value when the output clock signal is determined to be in a locked state, and
generating the division control signal having a second logic value when the output clock signal is determined to be in an unlocked state.

25. The method of claim 24, wherein generating the local clock signal includes,
generating the local clock signal with a first frequency while the division control signal has the first logic value, and
generating the local clock signal with a second frequency while the division control signal has the second logic value, the first frequency being lower than the second frequency.

26. The method of claim 24, wherein generating the local clock signal includes,
generating the local clock signal with a frequency lower than a loop bandwidth of the DLL while the division control signal has the first logic value, and
generating the local clock signal with a frequency higher than the loop bandwidth of the DLL while the division control signal has the second logic value.

27. The method of claim 20, further including,
detecting a phase difference between the input clock signal and the output clock signal to generate the division control signal based on the phase difference,
updating a phase of the output clock signal with a first phase-update frequency and a first phase variation during a fine locking time interval when the division control signal indicates the output clock signal is in a locked state, and
updating the phase of the output clock signal with a second phase-update frequency and a second phase variation during the fine locking time interval when the division control signal indicates the output clock signal is in an unlocked state.

28. The method of claim 27, wherein the first phase-update frequency is lower than the second phase-update frequency.

29. The method of claim 27, further including,
updating the phase of the output clock signal with a third phase-update frequency and a third phase variation during a coarse locking time interval, the third phase variation being greater than the first and second phase variation.

30. The method of claim 27, further including,
updating the phase of the output clock signal with a phase-update frequency higher than a loop bandwidth of a DLL and a phase variation greater than the first and second phase variations until the output clock signal is determined to be in a locked state, if the phase of the output clock signal is determined to be out of a first phase difference during the fine locking time interval.

* * * * *